(12) United States Patent
Mabry et al.

(10) Patent No.: US 6,330,971 B1
(45) Date of Patent: Dec. 18, 2001

(54) RADIO FREQUENCY IDENTIFICATION SYSTEM AND METHOD FOR TRACKING SILICON WAFERS

(75) Inventors: Frank Robert Mabry, Spartanburg, SC (US); James Scott Rhodes, Redmond, WA (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/677,909

(22) Filed: Oct. 3, 2000

Related U.S. Application Data

(63) Continuation of application No. 09/129,247, filed on Aug. 5, 1998, now abandoned.
(60) Provisional application No. 60/091,961, filed on Jul. 7, 1998.

(51) Int. Cl.[7] .................................................. G06K 15/00
(52) U.S. Cl. ........................ 235/383; 235/376; 235/385; 340/10.1
(58) Field of Search .................................... 235/375, 376, 235/384, 385, 492, 383; 340/10.52, 10.1, 10.5, 928; 342/374; 705/28, 29

(56) References Cited

U.S. PATENT DOCUMENTS

| | | |
|---|---|---|
| 4,242,663 | 12/1980 | Slobodin . |
| 4,570,058 | 2/1986 | Havassy . |
| 4,588,880 | 5/1986 | Hesser . |
| 4,780,602 | 10/1988 | Kawana et al. . |
| 4,807,140 | 2/1989 | Saulnier . |
| 4,827,110 | 5/1989 | Rossi et al. . |
| 4,888,473 | 12/1989 | Rossi et al. . |
| 4,937,581 | 6/1990 | Baldwin et al. . |
| 5,097,421 | 3/1992 | Maney et al. . |
| 5,389,769 | 2/1995 | Yamashita et al. . |
| 5,430,441 | 7/1995 | Bickley et al. . |
| 5,448,110 | 9/1995 | Tuttle et al. . |
| 5,481,102 | 1/1996 | Hazelrigg, Jr. . |
| 5,497,140 | 3/1996 | Tuttle . |
| 5,592,295 | 1/1997 | Stanton et al. . |
| 5,729,236 | 3/1998 | Flaxl . |
| 5,805,082 | * 9/1998 | Hassett .............................. 235/384 X |
| 5,866,024 | * 2/1999 | De Villeneuve ................. 235/384 X |
| 5,869,820 | 2/1999 | Chen et al. . |
| 6,164,530 | * 12/2000 | Cheesebrow et al. ........... 235/376 X |
| 6,167,374 | * 12/2000 | Shaffer et al. ....................... 704/227 |

FOREIGN PATENT DOCUMENTS

| | | | |
|---|---|---|---|
| 0 473 102 A2 | * | 3/1992 | (EP) . |
| 0562622A1 | | 9/1993 | (EP) . |
| 0676711A2 | | 10/1995 | (EP) . |
| 0782001A1 | | 7/1997 | (EP) . |

* cited by examiner

*Primary Examiner*—Michael G. Lee
*Assistant Examiner*—Jared J. Fureman
(74) *Attorney, Agent, or Firm*—Senniger, Powers, Leavitt & Roedel

(57) ABSTRACT

A system and method for tracking semiconductor wafers through processing operations performed at a plurality of stations. A reader reads information relating to and identifying the wafers from a tag mounted on a wafer carrier. The tag has a memory which includes a plurality of pages storing the information. A plurality of antennas are connected to the reader. The antennas each have a transmission range which defines a reader position and the reader and tag communicate by radio frequency signals via one of the antennas when the carrier is at the respective reader position. A host computer and reader communicate in accordance with an interface protocol by which the host computer commands the reader to read the stored information from one or more selected tag pages and the reader provides the stored information read from the selected tag pages to the host computer.

20 Claims, 3 Drawing Sheets

| FACTORY ID NUMBER |
| CASSETTE ID CODE |
| LOT ID |
| PLANT ORDER NUMBER |
| CURRENT OPERATION |
| CURRENT QUANTITY |
| RESERVED |
| TOTAL CASSETTE LOOPS |
| CASSETTE LOOPS SINCE BAKEOUT |
| FLAG: INPROCESS OR WAITING |
| RESERVED |

FIG. 2

RADIO FREQUENCY IDENTIFICATION SYSTEM AND METHOD FOR TRACKING SILICON WAFERS

CROSS-REFERENCE TO RELATED APPLICATIONS

This application is a continuation of commonly assigned application Ser. No. 09/129,247, filed Aug. 5, 1998, abandoned, which claims the benefit of provisional application Serial No. 60/091,961, filed Jul. 7, 1998, the entire disclosures of which are incorporated herein by reference.

BACKGROUND OF THE INVENTION

This invention relates generally to improvements in tracking silicon wafers and, particularly, to a radio frequency identification system and method using a custom interface protocol for tracking silicon wafers through various stages of the wafer manufacturing process.

Most processes for fabricating semiconductor electronic components start with monocrystalline, or single crystal, silicon in the form of wafers. In general, semiconductor wafers are produced by thinly slicing a single crystal silicon ingot. After slicing, each wafer undergoes a number of processing operations to shape the wafer, reduce its thickness, remove damage caused by the slicing operation, and to create a highly reflective surface.

As an example, the manufacturing process includes rounding the peripheral edge of each wafer first, such as by an edge grinding operation, to reduce the risk of wafer damage during further processing. Next, a lapping process removes material from the front and back surface of each wafer to remove surface damage caused by the slicing operation and to make the opposing front and back surfaces of the wafer generally flat and parallel. The wafers are then etched by fully immersing each wafer in a chemical etchant to further reduce the thickness of the wafer and remove mechanical damage produced by the lapping and/or grinding operation. This produces a smooth surface on the wafer. Finally, the front surface of each wafer is polished, using a polishing pad and a polishing slurry made up of abrasive particles and a chemical etchant, to remove a small amount of material from the front surface of each wafer. The polishing operation removes damage induced by the etching operation and produces a highly reflective, damage-free surface on at least one face of each wafer. It is upon this polished face that integrated circuit fabrication takes place. In addition to various wafer shaping processes, wafers typically undergo a number of tests to measure their characteristics and quality before they are used in the manufacture of semiconductor electronic components.

Typically, the different steps of the wafer shaping and testing processes are performed at different locations within a semiconductor wafer manufacturing plant. For this reason, wafers must be transported facility-to-facility within the plant. A wafer carrier holds multiple wafers in position for transport between the different processing steps. Some processing steps occur with the wafers in the carrier while the wafers are removed from the carrier (and then returned) for other processing steps. For example, a wafer cassette formed with integral dividers defining slots, each of which receives a wafer, holds multiple wafers with minimal contact of the front and rear surfaces of the wafer. The wafers may be loaded into and unloaded from the cassette slots manually, or automatically by presently available machinery. Commonly assigned U.S. Pat. No. 5,592,295, the entire disclosure of which is incorporated herein by reference, discloses a wafer cassette of conventional construction for holding a plurality of semiconductor wafers.

For a number of reasons, including quality control, wafer manufacturers desire to track wafer lots as they travel facility-to-facility within a plant and to record process data on each lot cut from a particular ingot through final packing. In this respect, a single lot may comprise one or more cassettes and each cassette, loaded with wafers cut from a specific ingot, may travel independently of the other cassettes in the same lot.

Several devices are presently available for automatically identifying various objects, including bar-code reading and optical character recognition, for use in warehousing, distribution and manufacturing processes. Such identification devices visually identify distinctive markings on an object (e.g., a unique bar-code label) to identify it. Although these devices are useful in many applications, water, acids, and other substances associated with wafer processing are often destructive to the medium. Further, the ink used in the bar-codes can contaminate the wafers.

U.S. Pat. Nos. 4,827,110 and 4,888,473, the entire disclosures of which are incorporated herein by reference, describe systems for monitoring the progress of wafers through multiple processing operations using a transponder tag attached to the wafer carrier. In these patents, the transponder tags are coded to identify the carrier and a batch of wafers contained in the carrier. A remote recognition reader drives an associated antenna to propagate a radio frequency (RF) signal and the transponder tags identify the associated carrier in response to the RF signal. The systems disclosed in these patents, however, are controlled by mini-RF modules which cannot be custom programmed. In addition, the mini-RF module signal output requires the reader to be located in very close proximity to each antenna (i.e., read point). This is not acceptable in all applications within the relatively close quarters in semiconductor wafer process lines. Further, conventional identification devices lack several advanced functional parameters and cannot be upgraded to meet desired specifications.

For these reasons, a system is desired for tracking wafer lots which provides improved automatic identification, tracking and data collection as well as custom protocol interfaces with designated equipment.

SUMMARY OF THE INVENTION

The invention meets the above needs and overcomes the deficiencies of the prior art by providing an improved system and method of tracking semiconductor wafers. This is accomplished by a radio frequency identification system having an encapsulated multi-page tag mounted on a wafer carrier and an associated tag reader. Advantageously, the present invention uses a custom interface protocol which is well-suited for communicating one or more selected pages of data, including identifying information, between the tag and the reader and between the reader and a host computer. The reader transmits and receives messages via a plurality of antennas, each located near a wafer processing station. The host computer also controls the reader to write information to update the information stored in a particular tag or to transfer information from one tag to another in the event that the wafers are unloaded from the carrier. In addition, such system is economically feasible and commercially practical and such method can be carried out efficiently and economically.

Briefly described, a system embodying aspects of the present invention tracks semiconductor wafers through processing operations performed at a plurality of stations. The system includes a tag mounted on a wafer carrier in which the wafers are loaded for transport between the stations. The tag includes a memory which has a plurality of pages storing information relating to the wafers in the carrier. The stored information includes information identifying the carrier. The system also includes a reader for reading the stored information from the tag pages. The reader and tag communicate by radio frequency signals via one of a plurality of antennas connected to the reader. Each antenna is located proximate to one or more of the stations and has a transmission range which defines a reader position. The reader and tag communicate when the carrier is at the respective reader position. The system further includes a host computer for processing the stored information read by the reader to track the wafers. The host computer and reader communicate in accordance with an interface protocol by which the host computer commands the reader to read the stored information from one or more selected tag pages and the reader provides the stored information read from the selected tag pages to the host computer.

Generally, another form of the invention is a method of tracking semiconductor wafers through processing operations performed at a plurality of stations. The method includes the step of mounting a tag on a wafer carrier in which the wafers are loaded for transport between the stations. The tag includes a memory which has a plurality of pages storing information relating to the wafers in the carrier. The stored information includes information identifying the carrier. The method also includes connecting a plurality of antennas to a reader for reading the stored information from the tag pages and locating each antenna proximate to one or more of the stations. Each antenna has a transmission range which defines a reader position and the method includes the step of communicating between the tag and the reader by radio frequency signals via one of the antennas when the carrier is at the respective reader position. The method further includes the step of interfacing a host computer with the reader in accordance with an interface protocol by which the host computer commands the reader to read the stored information from one or more selected tag pages and the reader provides the stored information read from the selected tag pages to the host computer and the step of processing the stored information read by the reader with a host computer to track the wafers.

Yet another form of the invention is a method of interfacing a radio frequency identification (RFID) system to a host computer. The RFID system includes a tag having a memory which includes a plurality of pages for storing information. The RFID system also includes a reader for reading information from the tag pages. The method first includes the step of storing information identifying the tag in one of the tag pages. The method also includes the steps of generating a radio frequency interrogation signal with the reader, transmitting the interrogation signal with an antenna connected to the reader and generating a radio frequency reply signal with the tag in response to the interrogation signal. The antenna has a transmission range which defines a reader position and the tag receives the interrogation signal when the tag is at the reader position. The tag is responsive to the interrogation signal for initiating communication between the reader and the tag. The method further includes the step of interfacing the host computer with the reader in accordance with an interface protocol. The interfacing step is responsive to the reply signal and includes communicating unsolicited data messages from the reader to the host computer and communicating query commands from the host computer to the reader in response to the unsolicited data messages. The commands cause the reader to read the information from one or more selected tag pages in response to the data messages and to provide the information read from the selected tag pages to the host computer.

Alternatively, the invention may comprise various other methods and systems.

Other objects and features will be in part apparent and in part pointed out hereinafter.

BRIEF DESCRIPTION OF THE DRAWINGS

FIG. 2 is a block diagram of a multi-page memory of a transponder of the system of FIG. 1.

Corresponding reference characters indicate corresponding parts throughout the drawings.

DETAILED DESCRIPTION OF PREFERRED EMBODIMENTS

Figure 1:
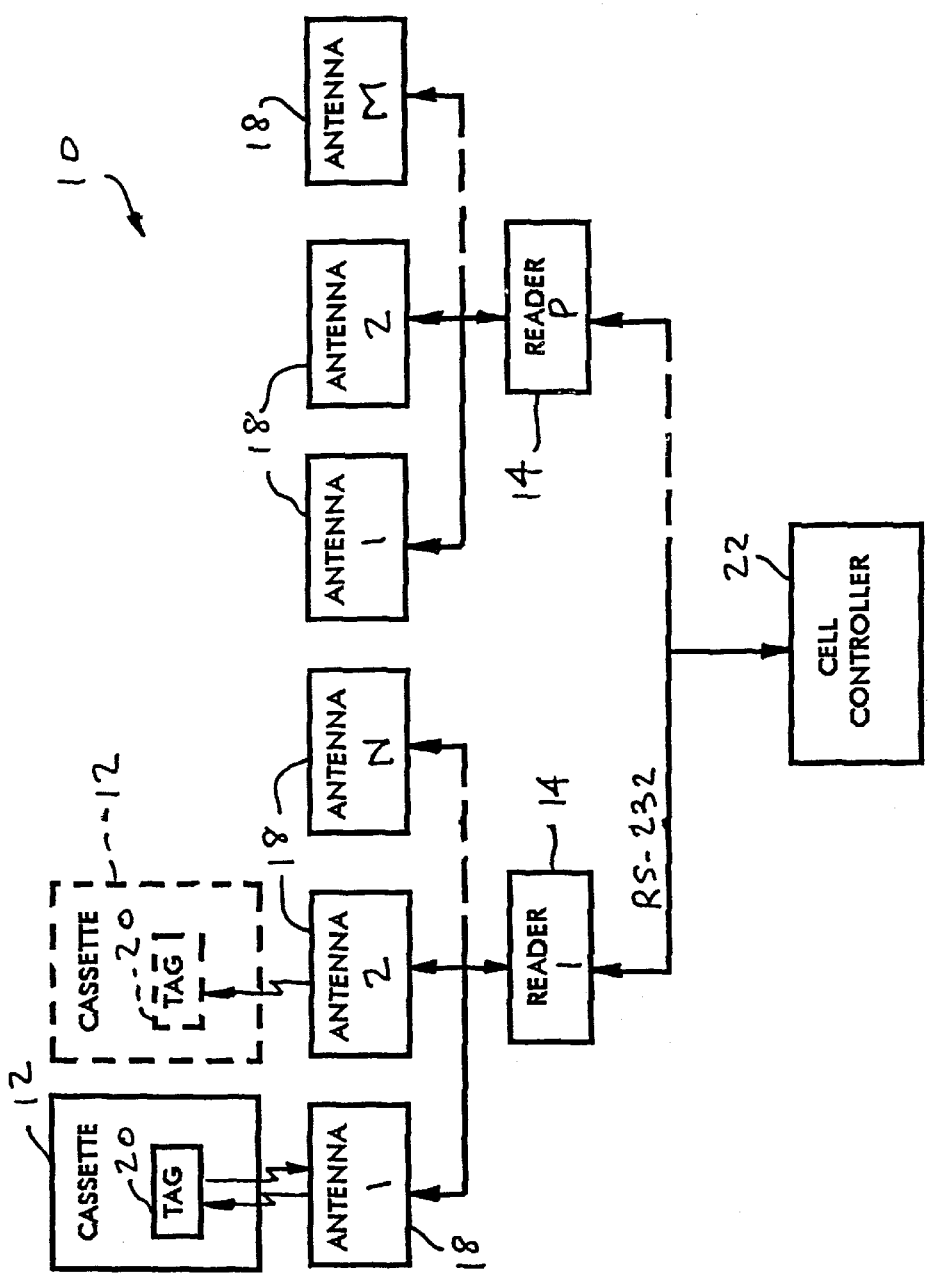
FIG. 1 is a block diagram of a lot tracking system according to a preferred embodiment of the invention.

Referring now to FIG. 1, an exemplary block diagram illustrates a system 10 for identifying containers for tracking through a number of different facilities in a plant. In particular, a typical semiconductor wafer manufacturing plant includes a plurality of facilities, or stations, each for performing one or more wafer processing operations. Since wafer processing operations are typically performed at different locations within the semiconductor plant, wafer lots must be transported facility-to-facility. In one embodiment, one or more wafer carriers, such as cassette 12, hold a plurality of wafers for transport between the stations. Some processing steps occur with the cassette 12 remaining at the antenna 18 while the wafers are removed from it (and then returned to one cassette 12 or another) for other processing steps. The system 10 provides automatic identification, tracking and data collection for lots of semiconductor wafers as they are transported throughout the manufacturing plant in cassettes 12.

In general, the present invention relates to a carrier data communication system which is part of a wafer tracking control system. The wafer tracking control system provides, for example, applications for operator interfaces, product work-in-process, container inventory, scheduling container moves, interlocking equipment, history and reporting as a function of data gathered by the communication system. The carrier data communication system includes data capture devices, control modules, power supplies, communication hardware and software to buffer the captured data. In this instance, the data capture devices employ radio frequency identification (RFID) tracking technology for capturing data from passive data carrying devices which are attached to cassettes 12.

An RFID controller, embodied by a configurable data collection reader 14 with a radio frequency (RF) module, transmits RF energy via at least one antenna 18. A relatively small FM radio transponder, or tag 20, mounted on each wafer cassette 12 receives the transmitted RF signal and generates a reply signal. The reader 14 receives the reply signal via the respective antenna 18. In this instance, the reply signal includes a unique identification (ID) code for the wafers in the particular cassette 12. Preferably, reader 14 supports a plurality of antennas 18. For example, reader 14 has four antenna ports to which the antenna leads are connected. Likewise, system 10 preferably includes a plurality of readers 14 depending on the size of the manufacturing plant. A preferred reader 14 is the Sircon IV Reader available from Sirit Corp.

In one embodiment of the invention, tag 20 is a multiple page read/write transponder capable of storing information relating to a unique carrier address, cassette lot number, plant order, current and next process operation, product count and other information valuable to the manufacturing process. A page is a fixed-length segment of data which is transferred as a unit. For example, tag 20 stores the ID code of its respective cassette 12 as a single page of data. For convenience and flexibility, a re-usable tag is contemplated so that the stored information may be rewritten (e.g., up to 100,000 times) as needed. A suitable tag is the TIRIS® multi-page read/write transponder manufactured by Texas Instruments which has 17 pages (80 bits each). Although described in connection with the wafer cassette 12, it is to be understood that tag 20 may also be embedded in or attached to other product carriers used in the manufacturing process (e.g., polishing blocks).

The compatible RFID reader 14 is also assigned a unique ID code and has read/write capabilities. Preferably, reader 14 supports both single page and multi-page transponders and has a processor (e.g., a Zilog Z80, 8 bit processor) which operates according to specific applications stored in memory (e.g., a 32k byte EPROM). Reader 14 uses eight logic outputs to drive a variety of external devices (e.g., lights, alarms and relays) and stores variable data in a 32k byte RAM with battery back up. In an alternative embodiment, reader 14 is embodied by a handheld unit.

A transponder is a receiver/transmitter device which automatically transmits signals when it receives the proper interrogation. In this instance, tag 20 receives the RF interrogation signal generated by reader 14 when cassette 12 (on which tag 20 is mounted) moves within range of one of the antennas 18. The RF signal transmitted by antenna 18 excites tag 20 into transmitting selected stored information back to antenna 18. In other words, when cassette 12 passes within a predetermined distance of one of the RFID antennas 18, reader 14 scans the tag 20 mounted on the cassette 12.

According to the invention, the RFID reader 14 uploads the information scanned from tag 20 to a cell controller 22 (e.g., a computer linked to a data network at the wafer processing facility). The cell controller 22 communicates with reader 14 to process the information for inventory tracking, mix prevention, work-in-process, automated machine set up and the like. Similarly, cell controller 22 downloads data to reader 14 for programming into tag 20 via antenna 18. In this manner, reader 14 and antenna 18 work together to generate, transmit, receive and read radio frequency transmissions. During manual testing, the cell controller 22 may be substituted with a terminal server.

In a typical wafer manufacturing plant, wafer cassette 12 travels between various fixed positions such as the input or output positions of a lapping machine, a position designated for collecting scrap wafers and the like. Preferably, system 10 defines a unique reader position corresponding to each of the different cassette positions and automatically reads the cassette ID to identify a particular wafer cassette 12 located at one of the reader positions. In this embodiment, the position of each antenna 18 and its transmission range defines a reader position so that each reader 14 is able to read information from a plurality of reader positions.

The reader 14 polls each antenna 18 connected to it continuously for the presence of one of the cassettes 18 equipped with tag 20. As an example, reader 14 multiplexes each antenna 18 sequentially, reading 64 bits of data from the RF transponder tag 20 on one of the cassettes 12 in approximately 90 milliseconds. Reader 14 reads the cassette ID of the cassette 12 located at one is of the reader positions and reports it to cell controller 22 as an event when cassette 12 is placed into a cassette location on a machine. Similarly, reader 14 reports a separate event when cassette 12 is removed from a cassette location and the cassette location becomes empty.

The system 10 includes an interface between cell controller 22 and the RFID multiple read/write circuitry (i.e., reader 14, antenna 18 and tag 20). The interface preferably operates according to a custom interface protocol having an ASCII format which uses, for example, an RS-232 or RS-485 interface. The type, amount, and format of data that can be transferred through an RS-232 or RS-485 compatible serial port is application specific, and reader 14 can be programmed to meet specific user requirements. In a preferred embodiment, reader 14 is fully capable of communicating with a variety of different controllers and host computers, in a variety of data formats. For example, a communications protocol and data format will be burned into the memory (e.g., an EPROM) of reader 14 prior to installation in system 10.

Appendix A provides an exemplary software specification which defines a communication interface protocol of the RFID system 10 using an ASCII command string format. In this embodiment, the interface protocol governs communication over an RS-232 port.

The interface protocol between reader 14 and cell controller 22 provides event messages indicating, for example, that reader 14 is available (i.e., it is "up") or that cassette 12 has arrived at or departed from a particular station. The protocol also provides system error messages when applicable. Cell controller 22 sends commands to RFID reader 14 to notify it that cell controller 22 is available. This also confirms to cell controller 22 that reader 14 is available. Position status reporting of a single reader position determines whether or not cassette 12 is present near the particular antenna 18.

According to the interface protocol of the present invention, a "read page request" from cell controller 22 activates RFID reader 14 to request a read and/or write from one or more pages of tag 20. Alternatively, a contact switch for detecting the presence of cassette 12 may also be used to trigger a read. In a preferred embodiment, the protocol uses page mapping to downwardly switch tag pages if one or more of the pages fail. As such, the first open page replaces the defective page. Advantageously, the interface protocol permits the multiple tasks of tracking and controlling carrier size lots in the silicon wafer process lines as well as other applications.

As described above, the read/write tag 20 mounted on cassette 12 has a unique factory identification number associated with it in addition to the cassette identification number which is written to it. In one embodiment, the cassette identification number is also engraved on cassette 12 near tag 20 for backup operation. As an example, the cassette ID has the following format shown in Table I:

TABLE I

| Character | Use | Values | Comments |
| --- | --- | --- | --- |
| 1 | Line Number | 0 | Use 0 if plant is not organized into lines |
| 2–3 | Loop Number | 01-99 | Different colors may also be used for loops |
| 4–7 | Cassette Sequence | 0001-9999 | |
| 8 | (reserved) | "X" | May be used for Plant ID code, for example |

FIG. 2 illustrates a memory 24 of tag 20 in block diagram form. As shown, an exemplary initial allocation of data in the read/write tag 20 stores different information in different pages. Generally, if one of the pages in use fails, system 10 allocates one of the unused pages to store the data from the failed page. However, the cassette ID is preferably write-locked on page 2 in one embodiment. The page map of each cassette 12 is stored in a database of cell controller 22. Table II provides a preferred initial page map for the present invention in accordance with FIG. 2.

TABLE II

| Page | Data |
| --- | --- |
| 1 | Factory ID number |
| 2 | Cassette ID code |
| 3–4 | Lot ID (local plant format) |
| 5–6 | Plant order number |
| 7 | Current operation (char. 1–4) and next operation (char. 5–8) in MES format |
| 8 | Current quantity (wafer count) |
| 9–10 | Reserved |
| 11 | Total cassette loops in lifetime |
| 12 | Cassette loops since bakeout |
| 13 | In-process flag: INPROCESS or WAITING |
| 14–17 | Reserved |

With respect to page mapping, system 10 operates according to four general principles. First, the cassette ID on page 2 is not allowed to be mapped elsewhere. This data is preferably written only once (and write-locked) during the life of cassette 12. Second, pages 3–17 are moved to the first open page if they fail. Third, the map of pages of each data item of tag 20 is stored in a data base associated with cell controller 22 for each cassette 12. Fourth, reader 14 need not to be aware of page mapping, since it reads and writes pages by number.

Figure 3:
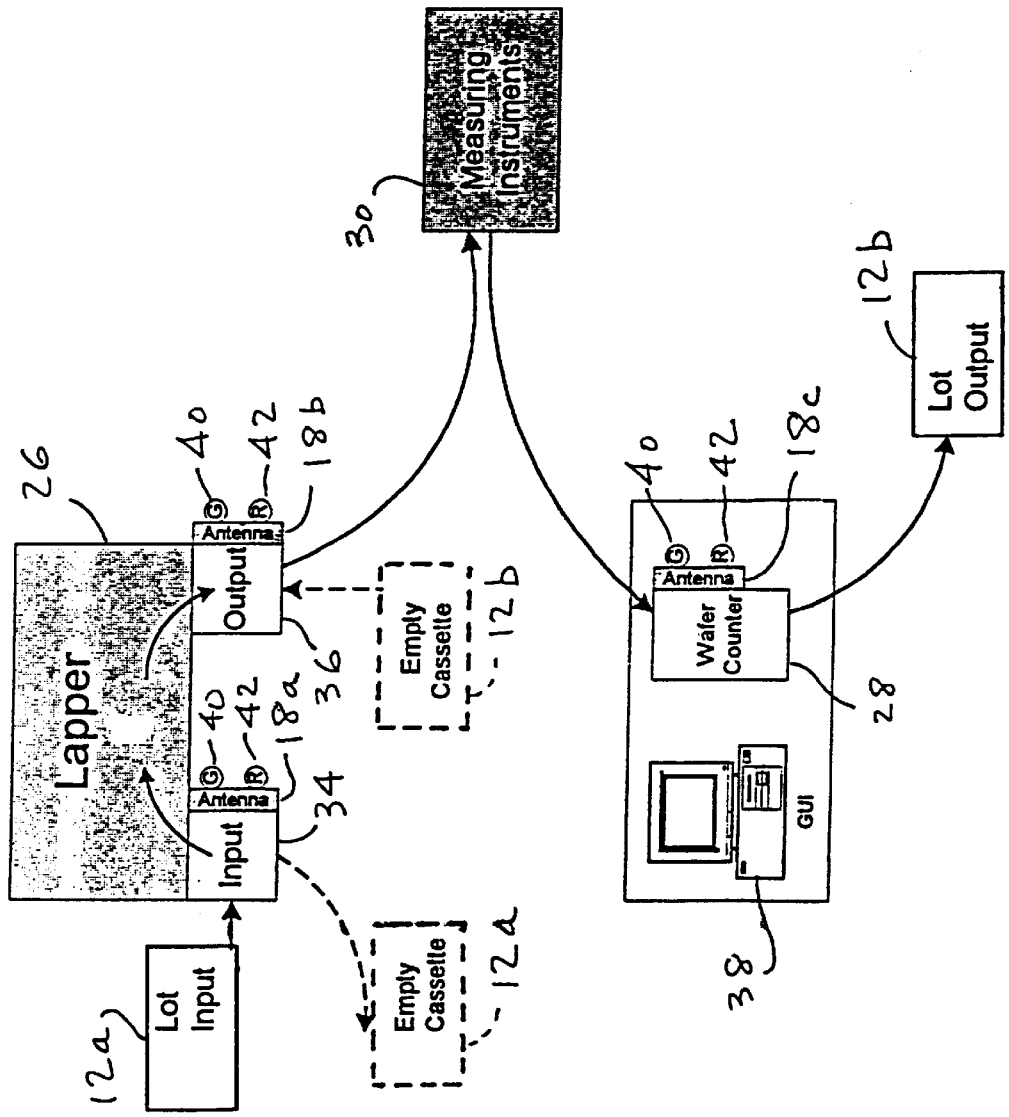
FIG. 3 is a block diagram of a wafer process employing the system of FIG. 1.

FIG. 3 illustrates the operation of system 10 in connection with three exemplary stations, namely, a lapping machine 26, a wafer counter 28 and a measuring station 30. It is to be understood that the wafer manufacturing plant for which system 10 is providing identification and wafer tracking information may include a plurality of lappers and/or wafer counters as well as various other machines. For simplicity, only a single lapping machine, or lapper, 26 and a single wafer counter 28 are shown in FIG. 3. In this instance, wafers arrive at lapper 26 in an input cassette 12a. Lapping machines such as lapper 26 are typically loaded manually to a capacity of, for example, 20 wafers. After the input cassette 12a arrives at an input cassette port 34, an operator removes the wafers and places them in lapper 26. Following the lapping process, an operator removes the wafers and places them in an empty output cassette 12b located at an output cassette port 36. It is to be understood that the same cassette as input cassette 12a may be used for output cassette 12b. The operator then moves the output cassette 12b to the measuring station 30 where the operator measures various characteristics of the wafers. As described above, system 10 is for use with a wafer tracking system. Advantageously, a computer 38 provides a graphical user interface (GUI) for use by the operator to input the measurements into the wafer tracking system.

Information associated with the wafers is read from the tag 20 on input cassette 12a and written to the tag 20 on output cassette 12b. If the operator loads output cassette 12b into output cassette port 36 of lapper 26 before unloading input cassette 12a, this information will exist with the wafer lot on at least one cassette 12 at lapper 26 during the entire operation.

The system 10 employs three antennas 18 for RFID identification and information transfer in the illustrated embodiment. Particularly, an antenna 18a is located in the vicinity of the input cassette port 34 and another antenna 18b is located in the vicinity of the output cassette port 36. In the illustrated embodiment, a third antenna, 18c is located in the vicinity of wafer counter 28. Ports 34, 36 and wafer counter 28 each define a cassette position and antennas 18a, 18b, 18c, respectively, define corresponding reader positions. Preferably, the three antennas 18a, 18b, 18c shown in FIG. 3 are connected to a single RFID controller (i.e., reader 14).

According to the invention, RFID reader 14 provides event messages to the host, cell controller 22, based on the information read from the respective tags 20 on the input and output cassettes 12a, 12b. These messages are, for example, "system controller up," "cassette arrived," "cassette removed" and "system error."

In operation, reader 14 continuously polls all three antennas 18a, 18b, 18c, waiting for a change to occur. As such, reader 14 detects the presence of input cassette 12a when it nears antenna 18a (i.e., when the operator places it in input cassette port 34). RFID reader 14 then reads the cassette ID on page 2 of tag 20 via antenna 18a. In turn, reader 14 sends a "cassette arrived" message to cell controller 22 to indicate the arrival of cassette 12 at a reader position. In a preferred embodiment, the "cassette arrived" message includes message ID, antenna and cassette ID data. The message provides cell controller 22 with information used for processing the wafer lot, including reader position, cassette ID and cassette data. In reply, cell controller 22 provides an OK or ER message.

The cell controller 22 uses a "read page request" message to request data from one or more pages of tag 20 at a single reader position. Reader 14 replies with the data from each page. Each page desired is specified in the request list, so any combination of pages can be requested. For example, the "read page request" message includes message ID, antenna and cassette ID data and identifies page 1 to page n. A normal reply from reader 14 also includes message ID, antenna and cassette ID data as well as data corresponding to each of the identified pages. A negative acknowledgement, or NAK, reply indicates that antenna 18 is incorrect or that cassette 12 is not present (or a wrong cassette is present). The NAK reply also includes message ID, antenna and cassette ID data as well as an error code.

In this embodiment, cell controller 22 verifies that cassette 12a is at the desired location and creates a new tasklist for processing the lot. Cell controller 22 then sends a "read page request" to reader 14, requesting that it read pages 3–10 and 13 of tag 20 at antenna 18a. In response, reader 14 reads the requested pages and assembles the results. When reader 14 has completed reading, it replies to the "read page request" by sending the requested data from tag 20 to cell controller 22. In a preferred embodiment, cell controller 22 cooperates with a remote wafer tracking system for tracking the various steps of in-process wafers. At this point, cell controller 22 preferably verifies that the tag data is correct and communicates an automatic move-in transaction to the wafer tracking system (to which the wafer tracking system replies with a move-in acknowledgement, or ACK).

According to the invention, reader 14 and cell controller 22 both generate signals for driving a pair of light emitting diodes (LEDs) to provide operator feedback. As shown in FIG. 3, a green LED 40 and a red LED 42 are associated with each antenna 18 for indicating successful or incomplete processing of the tag data. In addition, the green LED 40 indicates the presence of cassette 12 at the respective reader position and the red LED 42 indicates an error condition. In this instance, the "cassette arrived" event message sets the state of the green LED 40 for antenna 18a to blinking. This indicates that cassette 12a is present but it has not yet been confirmed by cell controller 22.

The cell controller 22 uses a "page write request" message to request that the data from one or more pages of tag 20 at a single reader position be written. Reader 14 replies with confirmation. By verifying the cassette ID, reader 14 prevents errors in writing data to tag 20. Each page to be written is identified, so any combination of pages can be written with one message. For example, the "page write request" message includes message ID, antenna and cassette ID data as well as page 1 to page n identifiers and corresponding data. A normal reply, ACK, from reader 14 also includes message ID, antenna and cassette ID data. A NAK reply indicates that antenna 18 is incorrect, that cassette 12 is not present (or the wrong cassette is present) or that the write was unsuccessful. The NAK reply also includes message ID, antenna and cassette ID data as well as an error code.

In this embodiment, cell controller 22 updates the RFID reader 14 with a "page write request" message by requesting that reader 14 write to page 7 (i.e., next operation) and page 13 (i.e., in-process flag) of tag 20 at antenna 18a. After performing these write functions, reader 14 sends a reply to cell controller 22 which signals completion. In response, cell controller 22 sends a "set LED states" request to reader 14 to set the state of the green LED 40 for antenna 18a to solid (i.e., to turn on LED 40). This indicates that cassette 12a is present and cell controller 22 has confirmed its status. In other words, cassette move-in is successful.

A "set LED states" message includes message ID and antenna data in addition to a new LED state (e.g., solid or blinking green LED 40, solid red LED 42 or normal off red LED 42). Cell controller 22 uses the "set LED states" message to set the state of the green LED 40 from blinking to solid after cell controller 22 has completed processing associated with cassette 12 as well as from solid back to blinking if desired. Also, it can set the red LED 42 on (turning off green LED 40) or off again. In reply, reader 14 provides a normal ACK reply which includes message ID, antenna and new state data or a NAK reply which indicates that antenna 18 is incorrect or that cassette 12 is not present (or the wrong cassette is present). The NAK reply also includes message ID, antenna and cassette ID data as well as an error code.

Typically, the operator manually unloads input cassette 12a and loads lapper 26 with the wafers. When the empty input cassette 12a is removed from input cassette port 34 at antenna 18a, RFID reader 14 detects its absence and sends a "cassette removed" message to cell controller 22. Similarly to the "cassette arrived" message, the "cassette removed" message includes message ID, antenna and cassette ID data. Preferably, the "cassette removed" event message sets the state of the green LED 40 for antenna 18a to off.

Reader 14 likewise detects the presence of output cassette 12b when it nears antenna 18b (i.e., when the operator places it in output cassette port 36). As before, RFID reader 14 reads the cassette ID of cassette 12b on page 2 of tag 20 via antenna 18b and responds to cell controller 22 with a "cassette arrived" message. In this instance, cell controller 22 verifies that the empty cassette 12b is at the desired location and sends a "page write request" to reader 14, requesting that it write to pages 3–8, 11 and 12 of tag 20 at antenna 18b, including the lot ID, plant order, next operation, quantity and increment cassette loops. After reader 14 performs these write functions, cell controller 22 uses a "set LED states" request to indicate that new lot data has been successfully transferred to tag 20 of cassette 12b.

After the lapping process, the operator unloads lapper 26 and loads output cassette 12b with wafers. Reader 14 detects the absence of the loaded output cassette 12b at antenna 18b when it is removed from output cassette port 36. Reader 14 sends another "cassette removed" message to cell controller 22 with the cassette ID and, in response, cell controller 22 sets the state of the green LED for antenna 18b to off.

Preferably, the operator performs various measurements on the wafers at measurement station 30 before loading output cassette 12b in the wafer counter 28. As before, reader 14 detects the presence of cassette 12b as it nears antenna 18c and reads the cassette ID on page 2 of tag 20. A "cassette arrived" event message sets the state of the respective green LED 40 to blinking. Preferably, wafer counter 28 communicates the wafer count to cell controller 22. Further, the operator may enter measurement data, counts and reason codes via the GUI computer 38 and cell controller 22 communicates an automatic move-out transaction to the wafer tracking system (to which the wafer tracking system replies with a move-out ACK).

A "page write request" message from cell controller 22 updates the RFID reader 14 with pages 7, 8 and 13 of tag 20 at antenna 18c, including the next operation, quantity and in-process flag. After performing these write functions, reader 14 sends a reply to cell controller 22 which signals completion. In response, cell controller 22 sends a "set LED states" request to reader 14 to set the state of the green LED 40 for antenna 18c to solid (i.e., to turn on LED 40).

This completes one tasklist of cell controller 22 for processing the wafer lot. The operator removes output cassette 12b from wafer counter 28 and moves it to the next operation (e.g., etching). Reader 14 detects the absence of cassette 12 at antenna 18c and sends a "cassette removed" message to cell controller 22 with antenna 18c. In this instance, the "cassette removed" message sets the state of the green LED 40 for antenna 18c to off.

In addition to providing event messages indicating the status of cassette 12, reader 14 also generates system status messages. Reader 14 sends the "system controller up" message when it is started to establish communications with cell controller 22. If cell controller 22 is running, then this message notifies it that the RFID system controller, reader 14, is available again. On the other hand, the failure to respond to this message informs reader 14 that cell controller 22 is not running. In general, the "system controller up" message includes a message ID and a list of active antennas 18. In reply, cell controller 22 provides an OK or ER message. For example, the ER reply causes reader 14 to resend the message up to three times. Reader 14 sends the "system error" message to cell controller 22 when it detects errors. In one embodiment, the error message provides cell controller 22 with reader position and includes message ID, antenna and error code data. Again, cell controller 22 replies with an OK or ER reply message.

Likewise, cell controller 22 provides status commands to reader 14 in addition to page read/write requests. Cell controller 22 sends the "cell controller up" message when it is started to establish communications with reader 14. If reader 14 is running, then this message notifies it that cell controller 22 is available again, and confirms to cell controller 22 that the RFID system controller is available. On the other hand, the failure to reply to this message informs cell controller 22 that reader 14 is not running. In general, the "cell controller up" message includes a message ID as does a normal reply from reader 14. Cell controller 22 also provides a "position status request" message including message ID and antenna data. In a normal ACK reply, reader 14 provides message ID, antenna and cassette ID data (the cassette ID is null if the reader position is empty). A NAK reply indicates that antenna 18 is incorrect. Cell controller 22 uses the "position status request" message to request the status of a single reader position. The RFID reader 14 replies with the reader position status as to whether cassette 12 is present or not.

In one preferred embodiment, system 10 recognizes different types of equipment and reads/writes tag data differently at the various events. For example, one processing station in the wafer manufacturing plant may include equipment with a single input/output location for cassette 12 (e.g., wafer counter 28). In this instance, wafers are reloaded or remain in the same cassette 12 after processing. On the other hand, another processing station may include equipment with both an input and an output location (e.g., lapper 26) where wafers are unloaded from one input cassette 12a and loaded into another output cassette 12b. When cassette 12 arrives at the single input/output location, reader 14 reads/writes tag data to read the cassette ID, verify operation start (move-in), write an in-process flag and set green LED 40 to solid. When cassette 12a arrives at the input only location, reader 14 reads/writes tag data to read the cassette ID, verify operation start (move-in), write an in-process flag, clear the next operation field and set green LED 40 to solid. When cassette 12b arrives at the output only location (which is a new lot assignment), reader 14 reads/writes tag data to read the cassette ID, wait (if necessary) for lot ID data from input cassette 12a, write lot ID, write plant order, write current/next operation, write the product quantity, write an in-process flag, update (read, increment, write) cassette use counts and set green LED 40 to solid.

Referring further to the LEDs 40, 42 which are associated with each antenna 18, red LED 42 indicates normal operating conditions when it is off and signals an error, for example, when it is on. In general, reader 14 turns the respective green LED 40 off if cassette 12 is not present. When cassette 12 arrives, LED 40 blinks, and when cell controller 22 confirms OK status, LED 40 goes on solid until cassette 12 is removed. Red LED 42 turns on when reader 14 loses communication with cell controller 22 and turns off when communication with cell controller 22 resumes. Cell controller 22 can also turn on red LED 42 to signal an error condition. When it is turned off, the state of green LED 40 is reinitialized to either off (no cassette present) or blinking (cassette present).

Table III provides an exemplary listing of the state transitions of green LED 40 and the state transitions of red LED 42 as they relate to the various events detected by system 10. In Table III, "CC com" is the status of communication between the cell controller 22 and the RFID controller 14 (as detected by RFID controller 14) where T indicates that communication is up and F indicates that communication is down. Further "CC er" refers to an error condition detected by cell controller 22 and communicated to RFID controller 14 for signaling on the LEDs. A value of T means that a "set LED red" message has been received from cell controller 22 to indicate an error condition detected by cell controller 22. A "set LED normal" message will return the value to F.

TABLE III

| | State | | | | New State | | | |
|---|---|---|---|---|---|---|---|---|
| Event | Green | CC com | CC er | Red | Green | CC com | CC er | Red |
| Cassette removed | Solid | T | F | Off | Off | T | F | Off |
| | Blink | T | F | Off | Off | T | F | Off |
| Cassette arrived | Off | T | F | Off | Blink | T | F | Off |
| Set message-Solid | Blink | T | F | Off | Solid | T | F | Off |
| Set message-Blink | Solid | T | F | Off | Blink | T | T | On |
| Set message-Error | any | T | F | Off | Off | T | F | Off |
| | Off | F | F | On | Off | F | T | On |
| Loss of CC communication | any | T | F | Off | Off | F | F | On |
| | Off | T | T | On | Off | F | T | On |
| Set Message-Normal (no cassette present) | Off | T | T | On | Off | T | F | Off |
| (cassette present) | Off | T | T | On | Blink | T | F | Off |
| Resume CC communication (no cassette present) | Off | F | any | On | Off | T | F | Off |
| (cassette present) | Off | F | any | On | Blink | T | F | Off |

In a preferred embodiment of the invention, tag 20 is encapsulated in a material, such as TEFLON® tetrafluoroethylene polymer, which protects it from the manufacturing environment. An enclosure likewise protects reader 14 (and its power supply). Preferably, antenna 18 is made from a chemically inert material and is also "weather-proof". For example, antenna 18 is a loop of wire encased in a non-ferrous material which is resistant to chemicals used in the processes.

Yet another advantage of the present invention is that antenna 18 may be positioned remotely from reader 14 (e.g., up to approximately 50 feet away). It is contemplated that antenna 18 includes a tuner circuit to permit even longer leads (e.g., up to approximately 300 feet) between reader 14 and antenna 18.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

APPENDIX A—RFID ASCII FORMAT

The specific ASCII command string, named ID system programming language (IDPL), has two kinds of commands: equipment commands (ECmd) and cell controller commands (CCmd). The first is an unsolicited data command from the equipment, namely, the RFID system controller, or reader, to the cell controller. The second is a query data command from the host, or cell controller, to the reader.

One preferred set of elementary ID system commands includes equipment commands System Controller Up, Cassette Arrived, Cassette Removed and System Error and includes host commands Cell Controller Up, Position Status Read, Read Page Request, Page Write Request and Set LED States.

Format of IDPL
<Type>,<Msg_id>,<Antenna>,<Data>,<Check_Sum>, <Terminated>
Type: command type (1 byte).
  '!'=unsolicited data
  '@'=query command
  '#'=reply data by query
Msg_id: Message identification (3 bytes) (see Table A)

TABLE A

| Message | Msg_id |
|---|---|
| System Controller Up | ESU |
| Cassette Arrived | ECA |
| Cassette Removed | ECR |
| System Error | EER |
| Cell Controller Up | CCU |
| Position Status Read | CSR |
| Read Page Request | CPR |
| Page Write Request | CPW |
| Set LED States | CSL |

If the first character of the command is 'E', then the command was sent from equipment to cell controller, but if the first character of the command is 'C', then the command was sent from cell controller to equipment.

Antenna: Antenna ID (1 byte). '1'–'4'
Data: Data fields depend on the command. The internal data fields are separated with <SPACE> as the token separator. Data for pages 2–17 is transferred as ASCII characters. The page data must be a fixed length for each page, with no commas or white space characters included. The host will check data for spaces before it sends a write command. It will replace any spaces with a substitute character, so the equipment will always see the page data of eight characters with no spaces. The initial substitute character will be '^' (caret). Page 1 of the tag's storage memory is Read Only 64-bit binary code, set at the factory. It will be converted to 16 ASCII hexadecimal codes from '0' to '9' and 'A' to 'F' for sending to the cell controller on a page read. Each code corresponds to four bits data of page 1. Pages 2–17 are transferred as an ASCII data stream.

Check_Sum: Four bytes hexadecimal codes for check sum. Add all characters (before check sum code), then transfer this check sum value into four hexadecimal-characters. For testing and manual operation, the equipment will also always accept the check sum value of 'AAAA' for any command.

Terminated: <CR><LF>(0X0D, 0X0A)

Features of the command
1. Command composes by ASCII string, it has the benefit of good readability and ease of testing.
2. Unused binary code.
3. Command string leads with character '@', '#' or '!' which terminates with <CR><LF>(OXOD, OXOA).
4. Command token separates with character ',' (comma).
5. Command character is upper case.
6. Unused or not applicable fields are filled with '*' (asterisk).
7. Page data is fixed length of eight characters.
8. Spaces, commas and non-printing characters may not be included in data read from or written to pages.

Format of Data The format of data is shown in Table B where '9' represents a numeric digit and 'x' represents any printing, non-space character except ','.

TABLE B

| Data | Size | Format |
|---|---|---|
| Cassette ID | 8 byte | 9999999X |
| ACK | 2 byte | OK |
| NAK with Error Code | 5 byte | ER999 |
| Paqe Data | 8 byte | xxxxxxxx |

Communication Scenario

The reader communicates unsolicited data commands to the cell controller (i.e., from equipment to host). In response, the cell controller replies with an acknowledgement (ACK) or negative acknowledgement (NAK) with an error code. In contrast, the cell controller communicates query commands to the reader (i.e., from host to equipment). In response to the query command, the reader replies with data, ACK or NAK with error code. In this example, the ACK code is 'OK' and the NAK with error code is 'ER' followed by three digits for error identification.

EXAMPLES

1. System Controller Up-ESU
   <Type>, <Msg_id>, <Antenna>, <data>, <Check_Sum>, <terminated>
   Send: !,ESU,*,1 2 3 4,AAAA<0dH><0aH>                    :E to C
   Reply: #,ESU,*,OK,AAAA<0dH><0aH>                        (ok) :C to E
        or
        #,ESU,'*',ER001,AAAA<0dH><0aH>                     (error)
2. Cassette Arrived-ECA
   <Type>, <Msg_id>, <Antenna>, <data>, <Check_Sum>, <terminated>
   Send: !,ECA,1,9999999X,AAAA<0dH><0aH>                   :E to C
   Reply: #,ECA,1,OK,AAAA<0dH><0aH)                        (ok) :C to E
        or
        #,ECA,1,ER001,AAAA<0dH><0aH>                       (error)
3. Cassette Removed-ECR
   <Type>, <Msg_id>, <Antenna>, <data>, <Check_Sum>, <terminated>
   Send: !,ECR,1,9999999X,AAAA<0dH><0aH>                   :E to C
   Reply: #,ECR,1,OK,AAAA<0dH><0aH>                        (ok) :C to E -continued

```
        or
    #,ECR,1,ER001,AAAA<0dH><0aH>                              (error)
4. System Error-EER
<Type>, <Msg_id>, <Antenna>, <data>, <Check_Sum>, <terminated>
Send: !,EER,1,9999,AAAA<0dH><0aH>                             :E to C
Reply: #,EER,1,OK,AAAA<0dH><0aH>                              (ok) :C to E
        or
    #,EER,1,ER001,AAAA<0dH><0aH>                              (error)
5. CC Up (Cell Controller Up)-CCU
<Type>, <Msg_id>, <Antenna>, <data>, <Check_Sum>, <terminated>
Send: @,CCU,*,*,AAAA<0dH><0aH)                                :C to E
Reply: #,CCU,*,OK,AAAA<0dH><0aH)                              (ok) :E to C
        or
    #,CCU,1,ER002,AAAA<0dH><0aH>                              (error)
6. Position Status Read-CSR
<Type>, <Msg_id>, <Antenna>, <data>, <Check_Sum>, <terminated>
Send: @,CSR,1,*,AAAA<0dH><0aH>                                :C to E
Reply: #,CSR,1,9999999X,AAAA<0dH><0aH>                        (ok) :E to C
        or
    #,CSR,1,,AAAA<0dH><0aH>                                   (ok, null
for empty cassette)
        or
    #,CSR,1,ER002,AAAA<0dH><0aH>                              (error)
7. Page Read Request-CPR
<Type>, <Msg_id>, <Antenna>, <data>, <Check_Sum>, <terminated>
Send: @,CPR,1,9999999X 2 5,AAAA>0dH><0aH>                     :C to E
Reply: #,CPR,1,9999999X 2 ddddd 5 dddddddd,AAAA<0dH><0aH>
                                                              (ok) :E to C
        or
    #,CPR,1,9999999X ER002,AAAA<0dH><0aH>                     (error)
(Page is numbered from 1 to 17.)
8. Page Write Request-CPW
<Type>, <Msg_id>, <Antenna>, <data>, <Check_Sum>, <terminated>
Send: @,CPW,1,9999999X2 ddd 5 dddddddd,AAAA<0dH><0aH> to E
Reply: #,CPW,1,9999999X OK,AAAA<0dH><0aH>                     (ok) :E to C
        or
    #,CPW,1,9999999X ER002,AAAA<0dH><0aH>                     (error)
(page is numbered from 2 to 17.)
9. Set LED States-CSL
<Type>, <Msg_id>, <Antenna>, <data>, <Check_Sum>, <terminated>
Send: @,CSL,1,S,AAAA<0dH><0aH>                                :C to E
        or
    @,CSL,1,B,AAAA<0dH><0aH>
        or
    @,CSL,1,R,AAAA<0dH><0aH>
        or
    @,CSL,1,N,AAAA<0dH><0aH>
Reply: #,CSL,1,OK,AAAA<0dH><0aH>                              (ok) :E to C
        or
    #,CSL,1,ER002,AAAA<0dH><0aH)                              (error)
```

What is claimed is:

1. A system for tracking semiconductor wafers through processing operations performed in a predetermined sequence at a plurality of stations, said wafers being loaded in one or more wafer carriers for transport between the stations, said system comprising:

a passive tag mounted on the carrier, said tag including a memory which has a plurality of pages storing information identifying the carrier and information relating to the wafers in the carrier and the sequence of processing operations to be performed at the stations, said stored information including information identifying the carrier and the processing operations, said information identifying the carrier being stored in a selected one of said tag pages and including data representative of a carrier identification address, said carrier identification address being stored in the selected one of the tag pages storing the information identifying the carrier and being permanently write-locked, said remaining tag pages including at least one reserved page to which information from another one of the pages is transferred in the event that the other page fails;

a reader for reading the stored information from the tag pages;

a plurality of antennas connected to the reader, each antenna being located proximate to one or more of the stations and having a transmission range which defines a reader position, said reader and tag communicating by radio frequency signals via one of the antennas when the carrier is at the respective reader position; and a host computer for processing the stored information read by the reader to track the wafers, said host computer and reader communicating in accordance with an interface protocol by which the host computer commands the reader to read the stored information from one or more selected tag pages and the reader provides the stored information read from the selected tag pages to the host computer.

2. The system of claim 1 wherein the reader generates a radio frequency interrogation signal to initiate communication between the reader and the tag, said tag being responsive to the interrogation signal for generating a radio frequency reply signal when the carrier is at the respective reader position, said reader receiving the reply signal via the respective antenna and reading the stored information from the selected tag pages in response thereto.

3. The system of claim 1 wherein the reader is responsive to the host computer for writing information to one or more selected tag pages and wherein the interface protocol includes event messages from the reader to the host computer providing status information to the host computer regarding the wafer processing operations and includes associated command messages from the host computer to the reader selecting the tag pages to be read from or written to in response to the event messages.

4. The system of claim 3 wherein the event messages include data representing an event, data identifying the respective antenna and data identifying the carrier.

5. The system of claim 4 wherein the event messages are representative of one or more of the following events: the reader is active, the carrier has arrived at the reader position, the carrier has been removed from the reader position and an error.

6. The system of claim 3 wherein the command messages include data representing a command, data identifying the respective antenna, data identifying the carrier and data identifying the selected tag pages.

7. The system of claim 6 wherein the command messages are representative of one or more of the following commands: request information regarding reader position status, request that selected tag pages be read and request that information be written to selected tag pages.

8. The system of claim 3 wherein the interface protocol includes a status message from the host computer to the reader representative of the host computer being active.

9. The system of claim 1 wherein the information stored in the tag pages includes data representative of one or more of the following: carrier identification address, wafer lot number, plant order, current operation, next operation and wafer count.

10. The system of claim 1 wherein the tag comprises a first tag and further comprising a second tag mounted on another carrier located at a different reader position, said first tag storing information relating to the wafers loaded in the respective carrier, and wherein the reader is responsive to the host computer for reading the stored information from the first tag and writing the stored information to the second tag.

11. The system of claim 1 further comprising a serial interface between the host computer and the reader.

12. The system of claim 1 further comprising a visual indicator associated with each antenna for providing status information to an operator of the system of the wafer processing operations occurring at the respective reader position.

13. The system of claim 12 wherein the visual indicator comprises a green light emitting diode and a red light emitting diode responsive to signals generated by the reader and/or the host computer.

14. A method of tracking semiconductor wafers through processing operations performed in a predetermined sequence at a plurality of stations, said wafers being loaded in one or more wafer carriers for transport between the stations, said method comprising the steps of:
mounting a passive tag on the carrier, said tag including a memory which has a plurality of pages storing information identifying the carrier and information relating to the wafers in the carrier and the sequence of processing operations to be performed at the stations;
storing information in the memory of the tag identifying the carrier and the processing operations, said information identifying the carrier being stored in a selected one of said tag pages and including data representative of a carrier identification address, said carrier identification address being stored in the selected one of the tag pages storing the information identifying the carrier, said remaining tag pages including at least one reserved page;
permanently write-locking the selected tag page storing the information identifying the carrier;
connecting a plurality of antennas to a reader for reading the stored information from the tag pages;
locating each antenna proximate to one or more of the stations, each antenna having a transmission range which defines a reader position;
communicating between the tag and the reader by radio frequency signals via one of the antennas when the carrier is at the respective reader position;
interfacing a host computer with the reader in accordance with an interface protocol by which the host computer commands the reader to read the stored information from one or more selected tag pages and the reader provides the stored information read from the selected tag pages to the host computer;
processing the stored information read by the reader with a host computer to track the wafers; and
transferring information to the reserved page from another one of the pages in the event that the other page fails.

15. A method of interfacing a radio frequency identification (RFID) system to a host computer, said RFID system including a tag having a memory which includes a plurality of pages for storing information and including a reader for reading information from the tag pages, said tag being mounted on a carrier for transporting semiconductor wafers between a plurality of stations in a predetermined sequence, said method comprising the steps of:
storing information identifying the carrier including data representative of a carrier identification address in a selected one of the tag pages, said remaining tag pages including at least one reserved page;
permanently write-locking the selected tag page storing the information identifying the carrier;
generating a radio frequency interrogation signal with the reader, said tag being responsive to the interrogation signal for initiating communication between the reader and the tag;
transmitting the interrogation signal with an antenna connected to the reader, said antenna having a transmission range which defines a reader position, said tag receiving the interrogation signal when the tag is at the reader position;
generating a radio frequency reply signal with the tag in response to the interrogation signal when the carrier is at the reader position; and
interfacing the host computer with the reader in accordance with an interface protocol, said interfacing step being responsive to the reply signal and including communicating unsolicited data messages from the reader to the host computer and communicating query commands from the host computer to the reader in response to the unsolicited data messages, said commands causing the reader to read the information from one or more selected tag pages in response to the data messages and to provide the information read from the selected tag pages to the host computer, said information identifying the carrier and relating to the wafers in the carrier and the sequence of processing operations to be performed at the stations; and transferring information to the reserved page from another one of the pages in the event that the other page fails.

16. The method of claim 15 wherein the commands cause the reader to write information to one or more selected tag pages in response to the data messages.

17. The method of claim 15 wherein the data messages include data representing status information of an event, data identifying the respective antenna and data identifying the tag.

18. The method of claim 15 wherein the commands include data representing a command message, data identifying the respective antenna, data identifying the tag and data identifying the selected tag pages.

19. The method of claim 15 wherein the interfacing step includes communicating a status message from the host computer to the reader representative of the host computer being active.

20. The method of claim 15 further comprising the steps of reading the information from the selected tag pages and writing the information read from the selected tag pages to one or more selected pages of another tag.

* * * * *